United States Patent [19]
Yajima et al.

[11] Patent Number: 4,936,252
[45] Date of Patent: Jun. 26, 1990

[54] EQUIPMENT FOR MANUFACTURING SEMICONDUCTOR DEVICES

[75] Inventors: Yusuke Yajima, Musashino; Hidekazu Okuhira, Hachioji; Kanji Tsujii, Nishitama; Seiichi Murayama, Kokubunji; Akira Shintani, Machida; Yasuo Wada, Bunkyo, all of Japan

[73] Assignee: Hitachi, Ltd., Tokyo, Japan

[21] Appl. No.: 180,051

[22] Filed: Apr. 11, 1988

Related U.S. Application Data

[63] Continuation of Ser. No. 893,182, Aug. 5, 1986, abandoned.

[30] Foreign Application Priority Data

Aug. 23, 1985 [JP] Japan .................. 60-183949

[51] Int. Cl.$^5$ .............................. C23C 16/48
[52] U.S. Cl. ..................... 118/722; 118/715; 427/53.1
[58] Field of Search .............. 118/715, 722, 723; 427/53.1

[56] References Cited

U.S. PATENT DOCUMENTS

| | | | |
|---|---|---|---|
| 3,364,087 | 1/1968 | Solomon | 427/53 |
| 4,260,649 | 4/1981 | Denison | 427/53.1 |
| 4,324,854 | 4/1982 | Beauchamp | 427/54.1 |
| 4,340,617 | 7/1982 | Deutsch | 427/53.1 |
| 4,343,829 | 8/1982 | Tochikubo | 427/53.1 |
| 4,444,801 | 4/1984 | Hongo | 427/10 |
| 4,451,503 | 5/1984 | Blum | 427/53.1 |
| 4,511,595 | 4/1985 | Inoue | 427/53.1 |
| 4,595,601 | 6/1986 | Horioka | 427/53.1 |
| 4,645,684 | 2/1987 | Osada | 427/53.1 |
| 4,655,849 | 4/1987 | Schachmeyer | 427/53.1 |

FOREIGN PATENT DOCUMENTS 140367 8/1984 Japan .

OTHER PUBLICATIONS

Andreatta Appl. Phys. Lett. 40(2), 1-15-82, pp. 183-185.

*Primary Examiner*—Richard Bueker
*Attorney, Agent, or Firm*—Antonelli, Terry, Stout & Kraus

[57] ABSTRACT

An equipment for manufacturing semiconductor devices has: a reaction chamber in which a substrate to be processed is placed; means for evacuating the reaction chamber; means for introducing a reaction gas into the reaction chamber; means for applying polarized light to the surface of the substrate for the purpose of depositing a thin film on the surface of the substrate using a photochemical reaction between the light and the reaction gas; and means for adjusting the direction of polarization of the light so as to be substantially perpendicular to the longitudinal axis of a stepped circuit pattern present on the surface of the substrate for the purpose of flattening the circuit pattern.

4 Claims, 4 Drawing Sheets

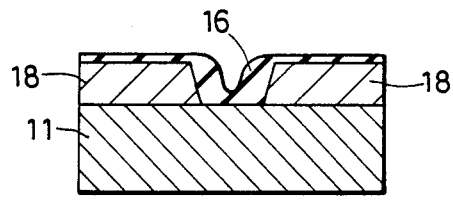
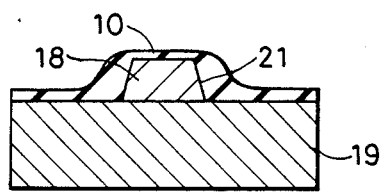
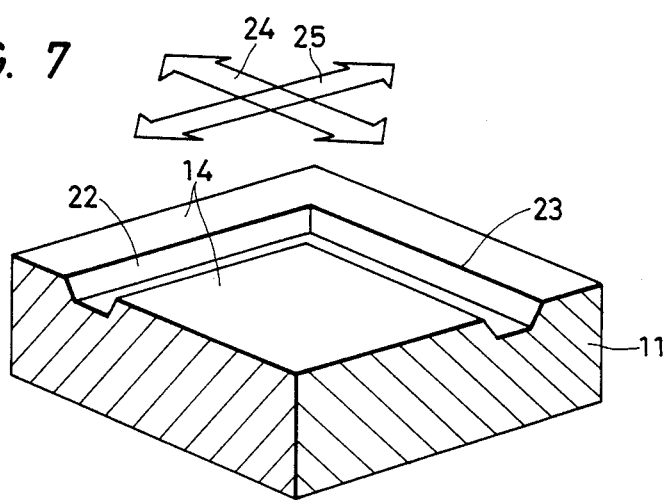

EQUIPMENT FOR MANUFACTURING SEMICONDUCTOR DEVICES

This is a continuation of application Ser. No. 893,182 filed Aug. 5, 1986 now abandoned.

BACKGROUND OF THE INVENTION

The present invention relates to an equipment for forming a film on a substrate to be processed using a photochemical reaction. More particularly, the present invention pertains to an equipment for manufacturing semiconductor devices which is suitable for forming a flat insulation film on a substrate to be processed having a stepped circuit pattern produced thereon.

To cope with the need for an increase in integration density of LSI devices, circuits are increasingly formed with multi-stratification. In order to attain multi-stratification, it is necessary to employ a technique for flattening the upper surface of insulation film even when the circuit pattern of the lower layer has a step. As a means for this purpose, the biased-sputtering method is presently utilized. In this method, etching proceeds in an oblique part of the insulation film, while deposition proceeds on a flat part thereof, and the uneven insulation film is therefore flattened as the processing progresses (see "Biased-sputtered $SiO_2$ film; its formation and characterization of film quality" by Tsunekawa, research report of the section of applied electronic solid state physics, No.404, 1984, p.30). In this method, however, discharge is utilized to form a flat insulation film, which disadvantageously involves a fear of the insulation film and an element thereunder being damaged by the impact applied thereto by the charged particles (see "Semiconductor World", Press Journal, November 1984, pp. 103 to 104).

SUMMARY OF THE INVENTION

In view of the above-described circumstances, it is a primary object of the present invention to provide an equipment for manufacturing semiconductor devices which enables a flat insulation film to be formed on a stepped circuit pattern with minimized damage.

To this end, the present invention utilizes a photochemical reaction which is so designed that the amount of reaction changes in accordance with an uneven or irregular pattern produced on the surface of a substrate to be processed, thereby making it possible to avoid the generation of a damage to an element or an insulation film which is a problem conventionally experienced with plasma processes including the above-described biased-sputtering method. In addition, it is unnecessary, according to the present invention, to heat the substrate to a high temperature. More specifically, the present invention employs, as light which is required for progressing the photochemical reaction, at least one kind of linearly polarized light (light having a fixed plane of polarization) whose direction of polarization is specified, so as to provide selectivity of the amount of reaction with respect to a circuit pattern with irregularities formed on the surface of a substrate to be processed, thereby increasing the amount of reaction with respect to the side surfaces of an uneven part of the pattern as compared with a flat part of the pattern, and thus enabling a flat thin film to be formed on an uneven surface of the substrate.

BRIEF DESCRIPTION OF THE DRAWINGS

FIGS. 5 to 8 are views employed to describe second to fifth examples, respectively, of the present invention.

DESCRIPTION OF THE PREFERRED EMBODIMENTS

Figure 1:
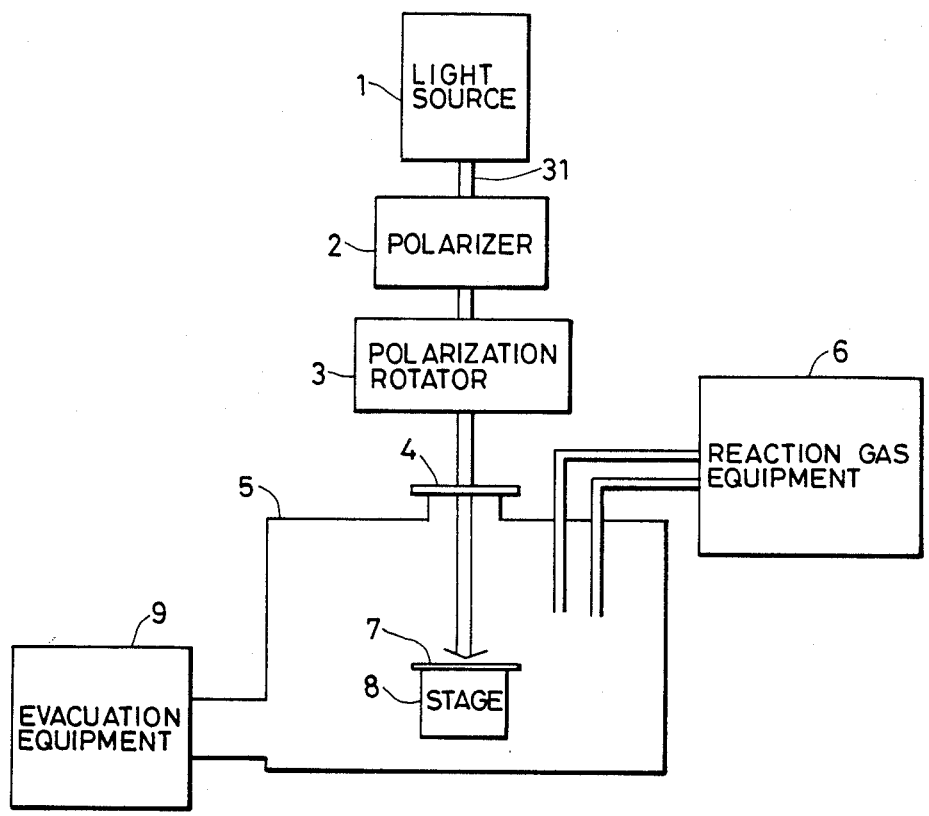
FIG. 1 shows a basic arrangement of one embodiment of the equipment for manufacturing semiconductor devices according to the present invention.

FIG. 1 shows the basic arrangement of one embodiment of the equipment for manufacturing semiconductor devices according to the present invention. In the figure: the reference numeral 1 denotes a light source for supplying light 31 which participates in a photochemical reaction; 2, a polarizer for fixing the direction of polarization of the light 31 emitted from the light source 1; 3, a polarization rotator for adjusting the direction of the polarization of the light 31 by rotating the plane of polarization of the light 31 within a horizontal plane; 4, an optical window; 5, a reaction chamber; 6, an equipment to provide reaction gases; 7, a substrate to be processed; 8, an adjustable substrate stage on which the substrate 7 is mounted and which is adapted to adjust the position of the substrate 7 and also the direction of polarization of the light 31 by rotating the substrate 7 within a horizontal plane in a manner similar to that of the polarization rotator 3; and 9, an equipment for evacuation.

In the equipment having the above-described arrangement, a substrate 7 to be processed such as a semiconductor substrate having an uneven or irregular pattern on the surface thereof is first mounted on the adjustable substrate stage 8 disposed inside the reaction chamber 5. Then, the reaction chamber 5 is evacuated by the evacuation equipment 9, and predetermined reaction gases which participate in a photochemical reaction are introduced into the reaction chamber 5 by the reaction gas equipment 6. Then, the light 31 which is emitted from the light source 1 and whose direction of polarization is determined by the polarizer 2 is allowed to enter the reaction chamber 5 through the optical window 4. The direction of polarization of the light 31 is adjusted with respect to the pattern on the substrate 7 by means of the polarization rotator 3 and the adjustable substrate stage 8, and the light 31 is then directed to the surface of the substrate 7. A photochemical reaction is progressed by the incident light 31 and the reaction gases, and a predetermined flat thin film is formed on the surface of the substrate 7 having an uneven pattern.

Figure 2A:
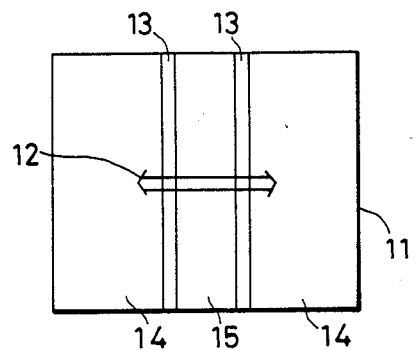
FIGS. 2A, 2B and 4A to 4C are views employed to describe a first example of the present invention.
Figure 2B:
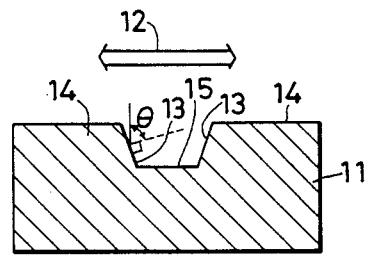

In the above-described embodiment, the light 31 from the light source 1 such as a lamp, the direction of polarization of which light 31 is not uniform, is polarized using the polarizer 2. However, it is also possible to employ a light source which emits light such as an ordinary laser whose direction of polarization is fixed without employing a polarizer. What is important is to arrange a light source or an optics in such a manner that light whose direction of polarization is specified is directed to a pattern on the surface of the substrate 7. In the above-described embodiment, further, both the plane of polarization of the light 31 and the substrate 7 are allowed to be rotatable in order to adjust the direction of polarization of the light 31. This is, however, not necessarily limitative, and the arrangement may be such that either the plane of polarization of the light 31 or the substrate 7 alone is made adjustable. The principle of the present invention will be described hereinunder in detail by way of practical examples. Example 1:

The operation in the first example in which the equipment according to the present invention is employed will be first explained below with reference to FIGS. 2A and 2B which are a plan view and a sectional view, respectively. In this example, a substrate 11 to be processed which has a linear groove is employed, and light whose direction of polarization 12 is perpendicular to this groove is made incident on the surface of the substrate 11 from the vertically upper side thereof (the light will hereinafter be referred to as "incident light"). The angle $\theta$ which is made between the normal with respect to the upper surface 14 of the substrate 11 and the bottom surface 15 of the groove and the normal with respect to the side surface 13 of the groove ranges from 50° to 80°. In many patterns which are formed on the surfaces of semiconductor elements, the inclination of the side surface 13 of the groove falls within the above-described angle range. More specifically, the incident angle of the incident light in this example is 0° (normal or vertical incidence) with respect to the upper surface 14 of the substrate 11 and the bottom surface 15 of the groove and $\theta$ with respect to the side surface 13 of the groove.

Figure 3:
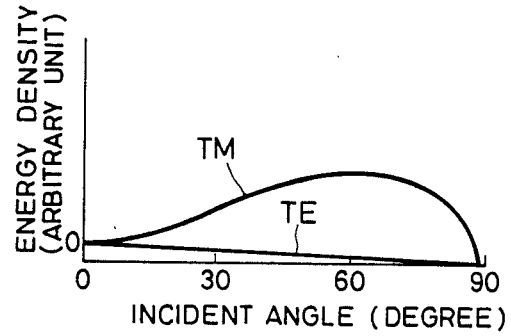
FIG. 3 is a view employed to describe the principle of the present invention.

The effect of the above-described difference in incident angle of the incident light on the light energy density at each of the surfaces 13, 14 and 15 will be explained below with reference to FIG. 3. In general, when light is incident on the surface of a solid, interference between the incident light and the reflected light occurs, and the light energy density at the solid surface therefore changes in accordance with the complex refractive index of the solid material at a predetermined wavelength of the incident light and the incident angle and direction of polarization of the incident light. FIG. 3 shows the general tendency of the dependence on incident angle of the light energy density in the case where the plane of polarization of the incident light is parallel to the incident plane (the plane including both the normal with respect to the substrate surface and the direction of travel of the incident light) (this will hereinafter be referred to as "TM wave") and in the case where said plane of polarization is perpendicular to the incident plane (this will hereinafter be referred to as "TE wave"). As will be understood from this figure, the light energy density of the TE wave monotonously decreases as the incident angle increases, but the light energy density of the TM wave reaches its maximum when the incident angle is within a range from about 50° to 80°.

It will be clear that, in the first example explained with reference to FIGS. 2A and 2B, the incident light as the TM wave is incident on the side surface 13 of the groove at the incident angle $\theta$. Since the incident angle $\theta$ ranges from 50° to 80° as described above, the light energy density at the side surface 13 of the groove is higher than the light energy density at the upper surface 14 of the substrate 11 and the bottom surface 15 of the groove (the incident angle of the incident light at these surfaces is 0°). Accordingly, when the deposition of insulation film proceeds through a photochemical reaction of a reactant adsorbed on the surface of the substrate 11, the deposition rate of insulation film at the side surface 13 of the groove is higher than the deposition rate of insulation film at the upper surface 14 of the substrate 11 and at the bottom surface 15 of the groove.

Figure 4A:
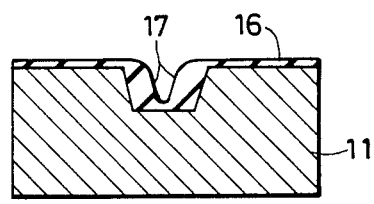
Figure 4B:
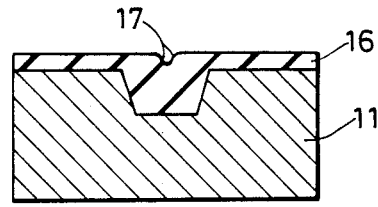
Figure 4C:
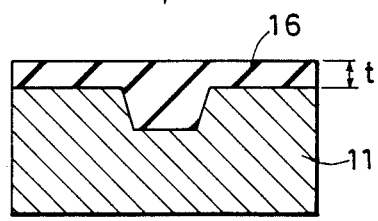

The progress of deposition of insulation film under such conditions is shown in FIGS. 4A to 4C. The deposition rate at oblique portions 17 on the surface of a deposited film 16 is higher than that at a flat portion of the film surface, so that the groove in the surface of the deposited film 16 gradually decreases. When the oblique portions 17 completely disappear and the surface is consequently flattened, the deposition rates at the various portions on the surface of the film 16 become equal to each other. In this example, a boron-doped single crystal of silicon was employed as the substrate 11 which was provided in the (100) plane thereof with a sufficiently long groove having an upper end width of 20μm, a lower end width of 14μm and a depth of 10μm by etching. This substrate 11 was held at a temperature of 500° C. in the ($Si_2H_6 + NH_3$) atmosphere, and an ArF excimer laser beam was applied to the surface of the substrate 11 from the vertically upper side thereof. The deposition rate of the insulation film 17 (silicon nitride) at the side surfaces 13 to the groove was about 2.5 times the deposition rate at the upper surface 14 of the substrate 11. When the thickness t of the deposited film on the upper surface 14 of the substrate 11 reached about 30μm, the surface of the insulation film 16 was completely flattened. It should be noted that the incident angle of the incident light with respect to the surface of the substrate 11 may be set at any angle other than 0° according to need.

EXAMPLE 2

A second example in which the equipment according to the present invention is employed will next be explained with reference to FIG. 5. In this example, an aluminum film 18 is evaporated in vacuo on the surface of a silicon substrate 11 and subjected to patterning so as to have a linear groove in a portion thereof in which the surface of the substrate 11 is exposed, and a silicon nitride insulation film is deposited thereon in such a manner that the surface of the insulation film is flattened. The conditions for the laser and reactions gases employed are similar to those in the first example, and description thereof is therefore omitted. With the method of flattening an insulation film which is employed in the equipment according to the present invention, once the deposition of film appropriately proceeds in the early stage of the processing, it is advantageously possible to ignore the effect of the material which constitutes the pattern on the deposition rate thereafter and on the selectivity of the deposition rate.

EXAMPLE 3

A third example in which the equipment according to the present invention is employed will be explained below with reference to FIG. 6. In this example, a pattern in which an aluminum film 18 is linearly evaporated in vacuo on the surface of a substrate 19 of silicon oxide is flattened by means of a silicon oxide insulation film 10. In this example, a gas mixture containing $SiH_4$ and $N_2O$ as principal components is employed as reaction gases, and an ArF excimer laser is employed as an excitation light source. In this case, the plane of polarization and the orientation of the substrate 19 are adjusted so that the incident light is applied to oblique side surfaces 21 of the aluminum film 18 as the TM wave, whereby it is possible to flatten the uneven pattern on the basis of a principle similar to that in the first and second examples.

EXAMPLE 4

Actual circuit patterns on LSI's are not always constituted by straight lines alone which extend in the same direction. However, in many cases, such circuit patterns are constituted by straight lines extending in two directions perpendicular to each other, and there is substantially no pattern which includes a straight line extending diagonally with respect to the above-described straight lines. A circuit pattern having the above-described characteristics is flattened in a fourth example. The fourth example will be explained below with reference to FIG. 7. In this example, two grooves 22 and 23 which extend orthogonally with respect to each other are cut in the surface of a substrate 11. To flatten such pattern, two kinds of light which respectively have directions of polarization 24 and 25 which are perpendicular to these grooves 22 and 23 are simultaneously made incident on the surface of the substrate 11. In consequence, the flattening of the deposited film on the upper surface 14 of the substrate 11 is advantageously completed when the thickness of the deposited film is smaller than that in the case where light whose direction of polarization is random is employed as incident light.

EXAMPLE 5

Figure 8:
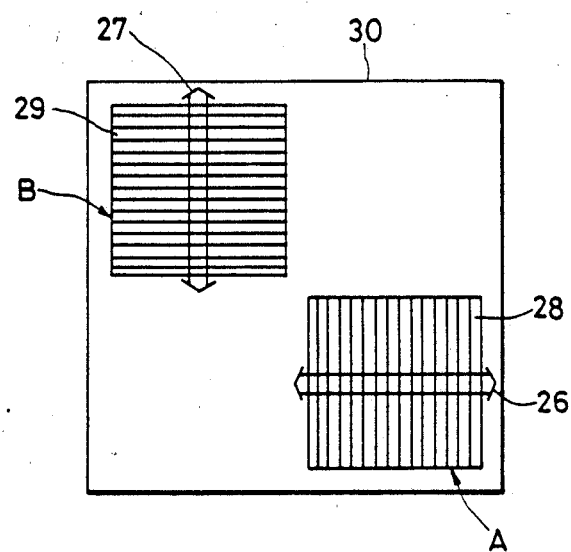

The following is a description of another example in which a circuit pattern is constituted by straight lines which extend in different directions rather than in the same direction. In this example, a substrate 30 to be processed is divided into a plurality of small portions, and the direction of polarization is independently set for each small portion to effect processing. FIG. 8 schematically shows such irradiation method. As illustrated, the portion A on the substrate 30 is irradiated with light having a direction of polarization 26, and the portion B is irradiated with light having a direction of polarization 27. This irradiation method is particularly effective in the case where, in the portions A and B on the substrate 30, the directions in which straight lines 28 or 29 constituting a circuit pattern extend are substantially uniform or equal to each other. More specifically, as shown in FIG. 8, the portion A is irradiated with light having a direction of polarizaiton 26 which is perpendicular to the directions in which the straight lines 28 constituting a circuit pattern extend, while the portion B is irradiated with light having a direction of polarization 27 which is perpendicular to the direction in which the straight lines 29 constituting a circuit pattern extend. Employment of such irradiation method enables the uneven pattern to be flattened while maintaining excellent irradiation conditions at both the portions A and B on the basis of the principle already described.

As has been described above, the equipment according to the present invention enables the deposition rate of a thin film by a photochemical reaction to be selectively changed in accordance with an uneven or irregular configuration of the surface of a substrate to be processed. It is therefore possible to effectively flatten the surface of an LSI substrate having a stepped circuit pattern. In addition, since the equipment according to the present invention utilizes a photochemical reaction, there is no fear of an element being damaged due to ions, high-speed charged particles or the like. Further, since it is not necessary to carry out a heat treatment at high temperature, there is no risk of element characteristics being deteriorated by a high-temperature treatment.

What is claimed is:

1. An equipment for manufacturing semiconductor devices comprising a reaction chamber provided with a substrate stage upon which a substrate having a stepped circuit pattern to be processed is placed; means for evacuating said reaction chamber; means for introducing a reaction gas into said reaction chamber; means for applying linearly polarized light to the surface of said substrate to deposit a thin film on the surface of said substrate using a photochemical reaction between said light and said reaction gas; said light application means comprising a light source for supplying light and a polarizer for making uniform the direction of polarization of light emitted from said light source; and means for adjusting a direction of polarization of said light so that said direction of polarization is in a plane including both a normal direction with respect to a side surface of said stepped circuit pattern and an incident direction of said light to said substrate.

2. An equipment for manufacturing semiconductor devices according to claim 1, wherein said adjustment means comprises a polarization rotator capable of rotating within a horizontal plane to adjust the direction of polarization of said light to said substrate.

3. An equipment for manufacturing semiconductor devices according to claim 2, wherein said adjustment means further comprises said substrate stage capable of rotating within a horizontal plane to adjust the direction of polarization of said light to said substrate.

4. An equipment for manufacturing semiconductor devices according to claim 1, wherein said adjustment means comprises a polarization rotator rotatable within a horizontal plane and said substrate stage rotatable within a horizontal plane to adjust the direction of polarization of said light to said substrate.

* * * * *